United States Patent
Butendeich et al.

(10) Patent No.: US 7,629,670 B2
(45) Date of Patent: Dec. 8, 2009

(54) RADIATION-EMITTING SEMI-CONDUCTOR COMPONENT

(75) Inventors: Rainer Butendeich, Regensburg (DE); Norbert Linder, Lappersdorf (DE); Bernd Mayer, Regensburg (DE); Ines Pietzonka, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/561,318

(22) PCT Filed: Jun. 25, 2004

(86) PCT No.: PCT/DE2004/001344

§ 371 (c)(1), (2), (4) Date: May 15, 2006

(87) PCT Pub. No.: WO2005/004244

PCT Pub. Date: Jan. 13, 2005

(65) Prior Publication Data

US 2006/0284192 A1 Dec. 21, 2006

(30) Foreign Application Priority Data

Jun. 27, 2003  (DE) ................................. 103 29 079

(51) Int. Cl.
*H01S 5/323* (2006.01)
(52) U.S. Cl. ........................ 257/609; 257/189; 257/615; 372/45.01
(58) Field of Classification Search .................... 257/79, 257/94, 102–103, 189, 200, 609; 372/45
See application file for complete search history.

(56) References Cited

U.S. PATENT DOCUMENTS

| 5,696,389 | A | * | 12/1997 | Ishikawa et al. | .............. 257/99 |
| 5,825,052 | A | | 10/1998 | Shakuda | |
| 6,072,196 | A | * | 6/2000 | Sato | ............................ 257/87 |
| 6,081,540 | A | * | 6/2000 | Nakatsu | ................... 372/45.01 |
| 6,337,536 | B1 | * | 1/2002 | Matsubara et al. | .......... 313/498 |

(Continued)

FOREIGN PATENT DOCUMENTS

DE   197 56 856   7/1998

(Continued)

OTHER PUBLICATIONS

First Office Action of Chinese Patent Application No. 200480018204.2, dated Jun. 8, 2007.

(Continued)

*Primary Examiner*—Wael Fahmy
*Assistant Examiner*—Abul Kalam
(74) *Attorney, Agent, or Firm*—Fish & Richardson P.C.

(57) ABSTRACT

In a radiation-emitting semiconductor component with a layer structure comprising an n-doped confinement layer, a p-doped confinement layer, and an active, photon-emitting layer disposed between the n-doped confinement layer and the p-doped confinement layer, it is provided according to the invention that the n-doped confinement layer is doped with a first n-dopant (or two mutually different n-dopants) for producing high active doping and a sharp doping profile, and the active layer is doped with only one second n-dopant, different from the first dopant, for improving the layer quality of the active layer.

9 Claims, 1 Drawing Sheet

U.S. PATENT DOCUMENTS

| | | | |
|---|---|---|---|
| 2002/0027935 A1 * | 3/2002 | Anayama | 372/46 |
| 2002/0053665 A1 | 5/2002 | Tsuda et al. | |
| 2002/1010499 * | 8/2002 | Kuo et al. | 257/79 |
| 2002/0149030 A1 | 10/2002 | Kean et al. | |
| 2005/0031000 A1 * | 2/2005 | Botez | 372/47 |

FOREIGN PATENT DOCUMENTS

| | | |
|---|---|---|
| EP | 0 762 516 | 3/1997 |
| EP | 0 772 247 | 5/1997 |
| EP | 1 079 444 | 2/2001 |
| EP | 0772249 B1 | 3/2006 |
| GB | 2 315 920 | 2/1996 |
| WO | WO 00/24097 | 4/2000 |

OTHER PUBLICATIONS

K.L. Chang et al., "Effect of group II Impurity and group III native defect on disordering Cu-Pt type ordered structures In $In_{0.5}(Al_xGa_{1-x})_{0.5}P$ layers", *Journal of Applied Physics*, vol. 92, No. 11, pp. 6582-6589 (Dec. 1, 2002).

*High Brightness Light Emitting Diodes*, Semiconductors and Semimetals, vol. 48, eds. G.B. Stringfellow, M.G. Crawford, Academic Press (1997), pp. 1-45, 65-83, and 149-178.

* cited by examiner

RADIATION-EMITTING SEMI-CONDUCTOR COMPONENT

CROSS-REFERENCE TO RELATED APPLICATIONS

This application is the National Stage of International Application No. PCT/DE2004/001344, filed Jun. 25, 2004, which claims the benefit of German Patent Application Serial No. 103 29 079.6, filed on Jun. 27, 2003. The contents of both applications are hereby incorporated by reference in their entireties.

FIELD OF THE INVENTION

The invention concerns a radiation-emitting semiconductor component with a layer structure comprising an n-doped confinement layer, a p-doped confinement layer, and an active, photon-emitting layer disposed between the n-doped confinement layer and the p-doped confinement layer.

BACKGROUND OF THE INVENTION

The confinement layers in the present case are material layers or sequences of material layers that are capable of confining charge carriers to a photon-generating active region of the layer structure.

In the present context, the term "confinement layer" encompasses both a single material layer and a sequence of material layers that comprises the function of a confinement layer. Analogously, the term "photon-emitting layer" encompasses both a single material layer and a sequence of material layers that is capable of emitting photons when operating.

The present patent application claims the priority of the German patent application having the application number 103 29 079.6 (priority date: Jun. 27, 2003), whose disclosure content is hereby incorporated into this application by reference.

In laser diodes and light-emitting diodes (LEDs) based on AlInGaP, but also on other material systems, efforts are made to obtain the highest possible n-doping in the confinement layers in order to minimize charge carrier losses due to leakage currents. At the same time, a sharp drop-off in doping at the edge of the waveguide of a laser diode is desirable to prevent increased absorption of the laser mode. If these conditions are met, however, the electrical, optical and/or electrooptical quality of the active layer (whether doped with the n-dopant or not) is frequently unsatisfactory. On the other hand, the use of other dopants that improve the electrical or optical quality of the active layer leads to other disadvantages, such as lower efficiency for the components produced.

SUMMARY OF THE INVENTION

The object of the present invention is to specify a radiation-emitting semiconductor component of the species recited at the beginning hereof, which exhibits improved electrical and/or optical quality of the active layer and/or a high efficiency.

In a radiation-emitting semiconductor component according to the invention, it is provided that the n-doped confinement layer is doped with a first n-dopant, particularly for producing high active doping and a sharp doping profile, and the active layer is doped with a second n-dopant different from the first dopant, particularly for improving the layer quality of the active layer.

The invention is therefore based on the idea of using two different n-dopants that are incorporated at different locations in the layer structure, so that the different properties of the two dopants can be exploited locally in a systematic manner.

The aforesaid first n-dopant is selected to permit the highest possible active doping of the confinement layer and a sharp doping profile. The active layer, by contrast, is doped with a second n-dopant that is suitable for improving the electrical and/or optical quality of said active layer. This improvement can in particular take the form of suppressing ordering effects, of the kind known for example from K. L. Chang et al., J. Appl. Phys. 92, 6582 (2002), or suppressing nonradiating centers.

In an advantageous configuration of the invention, it is provided that the n-doped confinement layer is doped both with the first n-dopant and with an additional dopant, particularly the second n-dopant. This achieves the result of increasing the active doping to the sum of the two active dopant concentrations. The advantage of high achievable doping and a sharp doping profile is simultaneously preserved.

In a preferred improvement of the invention, the semiconductor component is an LED. The active layer of the LED can in this case be formed by a homogeneous layer or by a quantum well or a multiple quantum well.

In another preferred improvement of the invention, the semiconductor component is an edge-emitting laser diode, in which a first waveguide layer is disposed between the active layer and the n-doped confinement layer and a second waveguide layer is disposed between the active layer and the p-doped confinement layer.

The first waveguide layer of the laser diode can be undoped or, like the active layer, doped with the second n-dopant. It can also, however, be doped with both of the n-dopants or with only the first n-dopant.

The second waveguide layer is preferably undoped.

Silicon is preferably used as the first n-dopant, since very high n-dopings as well as a sharply decreasing dopant profile can be obtained with silicon.

Telluride is preferably used as the second n-dopant. It has been found, surprisingly, that telluride has the property of suppressing undesired ordering effects in the active layer and generally improving the optical/electrical quality of the active layer. On the other hand, telluride diffuses very strongly during epitaxial growth, so using telluride as the sole dopant both for the confinement layer and for the active layer makes for components of comparatively low efficiency.

The p-doped confinement layers of the laser diodes or LEDs are preferably doped with magnesium or zinc.

The invention can be used with particular advantage in radiation-emitting semiconductor components whose layer structure is formed on the basis of AlInGaP.

Furthermore, the invention can also be used advantageously in connection with layer structures based on other material systems, such as for example AlGaAs, InGaAlAs or InGaAsP, in which ordering effects can occur or in which the electrical and/or optical quality of the active layer can be influenced by a dopant.

The group of such AlInGaP-based layer structures includes, first and foremost, any III-V compound semiconductor structure of the kind cited at the beginning hereof, suitable for a radiation-emitting semiconductor component, that has a layer sequence made up of different individual layers and contains at least one individual layer comprising a III-V compound semiconductor material composed of the material system $Al_xIn_yGa_{1-x-y}P$, in which $0 \leq x \leq 1$, $0 \leq y \leq 1$ and $x+y \leq 1$. Such a III-V compound semiconductor structure can, for example, comprise a conventional pn junction, a double heterostructure, a single quantum well structure (SQW structure) or a multiple quantum well structure (MQW structure). Structures of this nature are known to the skilled person and will therefore not be described in more detail herein.

The same applies to layer structures based on AlGaAs, InGaAlAs or InGaAsP.

In introducing the dopants, a dopant incorporation behavior that differs with growth temperature can be used to advantage. For example, the incorporation of silicon increases with increasing growth temperature, whereas the incorporation of telluride diminishes. The concentration of the various dopants in the structures of the component can thus be adjusted over a defined temperature profile.

BRIEF DESCRIPTION OF THE DRAWINGS

Further advantageous configurations, features and details of the invention will emerge from the following description of exemplary embodiments in conjunction with the drawings. Therein.

DETAILED DESCRIPTION OF THE PREFERRED EMBODIMENTS

It should be expressly noted that the layer structures and layer thickness ratios in the figures are not depicted true to scale.

First Exemplary Embodiment

Figure 1:
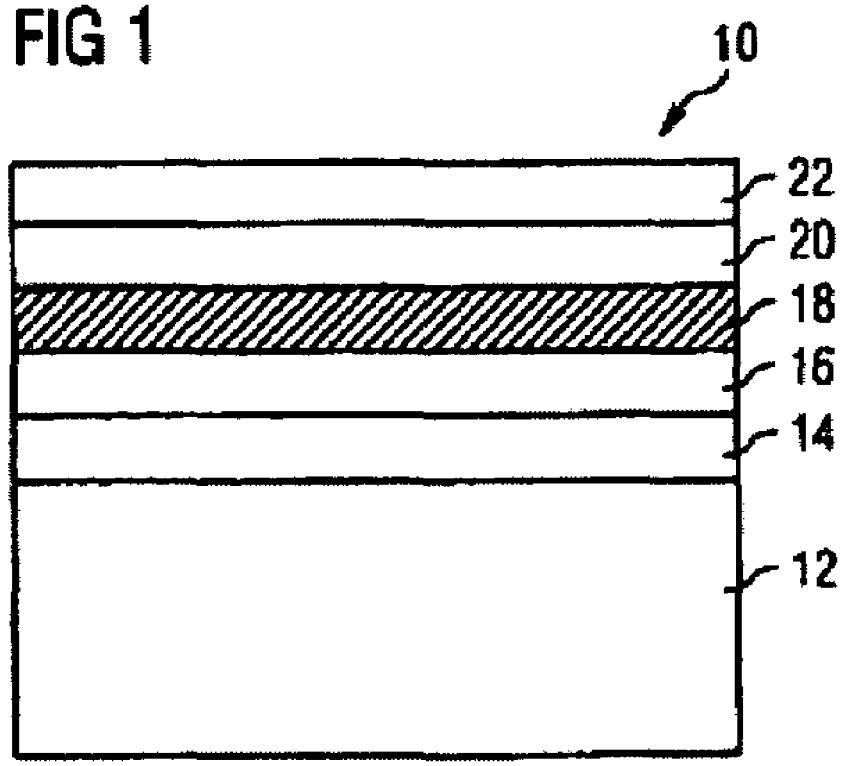
FIG. 1 is a schematic representation of a sectional view of a laser diode according to one exemplary embodiment of the invention.

The first exemplary embodiment of the invention, illustrated in schematic sectional view in FIG. 1, is an AlInGaP-based edge-emitting laser diode layer structure 10.

Only the layers essential to an understanding of the invention are depicted in the schematic representation of FIG. 1. It is understood, however, that additional layers, such as for example buffer layers, interlayers, contact layers, ramps and the like, may also be present.

In the laser diode layer structure 10, an AlInGaP-based layer sequence is grown on a silicon-doped GaAs substrate 12.

This AlInGaP-based layer sequence includes:
an n-doped $In_{0.5}(Al_xGa_{1-x})_{0.5}P$ confinement layer 14, preferably n-doped with silicon, on the GaAs substrate 12,
disposed after n-doped confinement layer 14 as viewed from GaAs substrate 12, a first $In_{0.5}(Al_xGa_{1-x})_{0.5}P$ waveguide layer 16 that is undoped,
disposed after undoped $In_{0.5}(Al_xGa_{1-x})_{0.5}P$ waveguide layer 16 as viewed from GaAs substrate 12, a telluride-doped active $In_zGa_{1-z}P$ layer 18,
disposed after telluride-doped active $In_xGa_{1-x}P$ layer 18 as viewed from GaAs substrate 12, a second $In_{0.5}(Al_yGa_{1-y})_{0.5}P$ waveguide layer 20 that is undoped, and
disposed after second $In_{0.5}(Al_yGa_{1-y})_{0.5}P$ waveguide layer 20 as viewed from GaAs substrate 12, a p-doped $In_{0.5}(Al_xGa_{1-x})_{0.5}P$ confinement layer 22 that is preferably p-doped with magnesium and/or zinc.

For the index variables x, y and z, here $0 \leq x \leq 1$, $0 \leq y \leq 1$ and $0 \leq z \leq 1$.

Silicon is used as the first n-dopant for the n-doped $In_{0.5}(Al_xGa_{1-x})_{0.5}P$ confinement layer 14 in this first exemplary embodiment. This achieves the effect in the n-doped $In_{0.5}(Al_xGa_{1-x})_{0.5}P$ confinement layer 14 of advantageously high n-doping plus a doping profile that exhibits a sharp drop-off.

Used as the second dopant, for the active $In_zGa_{1-z}P$ layer 18, is telluride, which serves to develop an active layer of advantageously high electrical and optical quality. In particular, telluride doping suppresses undesired ordering effects in the crystal structure of the active layer.

Second Exemplary Embodiment

In a second exemplary embodiment of the invention (see also FIG. 1), which again is an AlInGaP-based edge-emitting laser diode layer structure, in contrast to the above-described first exemplary embodiment the first $In_{0.5}(Al_xGa_{1-x})_{0.5}P$ waveguide layer 16 is also doped with telluride. This results in a layer sequence in which grown on the silicon-doped GaAs substrate 12 are an $In_{0.5}(Al_xGa_{1-x})_{0.5}P$ confinement layer 14 n-doped with silicon, a first $In_{0.5}(Al_xGa_{1-x})_{0.5}P$ waveguide layer 16 n-doped with telluride, an active $In_zGa_{1-z}P$ layer 18 n-doped with telluride, an undoped second $In_{0.5}(Al_yGa_{1-y})_{0.5}P$ waveguide layer 20 and an $In_{0.5}(Al_xGa_{1-x})_{0.5}P$ confinement layer 22 p-doped with magnesium or zinc.

The first $In_{0.5}(Al_xGa_{1-x})_{0.5}P$ waveguide layer 16 can optionally be doped with silicon in addition.

Doping the waveguide layer advantageously further reduces charge carrier losses and thus increases the efficiency of the component.

Third Exemplary Embodiment

In a third exemplary embodiment of the invention (see also FIG. 1), which again is an AlInGaP-based edge-emitting laser diode layer structure, the n-doped $In_{0.5}(Al_xGa_{1-x})_{0.5}P$ confinement layer 14 is, in contrast to the first exemplary embodiment, doped not with just one but with both of the n-dopants, i.e., both with the first and with the second n-dopant used, in order advantageously to increase the overall active dopant concentration ideally to the sum of the two dopant concentrations.

The first $In_{0.5}(Al_xGa_{1-x})_{0.5}P$ waveguide layer 16 can be undoped, or it can be doped with telluride or with silicon and telluride.

Overall, therefore, in this example a layer sequence comprising the following layers is grown on the silicon-doped GaAs substrate 12:
an $In_{0.5}(Al_xGa_{1-x})_{0.5}P$ confinement layer 14 n-doped with silicon and telluride,
a first $In_{0.5}(Al_xGa_{1-x})_{0.5}P$ waveguide layer 16 that is undoped or is n-doped with telluride,
an active $In_zGa_{1-z}P$ layer 18 n-doped with telluride,
an undoped second $In_{0.5}(Al_yGa_{1-y})_{0.5}P$ waveguide layer 20 and
an $In_{0.5}(Al_xGa_{1-x})_{0.5}P$ confinement layer 22 p-doped with magnesium or zinc.

Hence, as in the first exemplary embodiment, silicon is used as the first n-dopant and telluride as the second n-dopant. This again yields the advantages delineated hereinbefore.

Fourth Exemplary Embodiment

Figure 2:
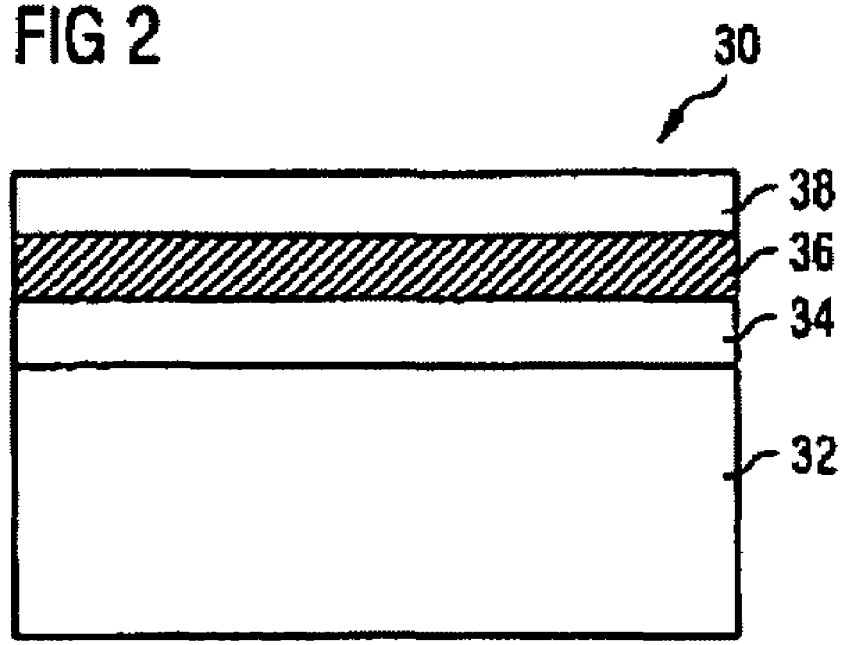
FIG. 2 is a schematic sectional view of an LED according to another exemplary embodiment of the invention.

The fourth exemplary embodiment of the invention, depicted in schematic sectional view in FIG. 2, is an AlInGaP-based LED layer structure 30 grown on a silicon-doped GaAs substrate 32.

This AlInGaP-based layer sequence 30 includes:
an n-doped $In_{0.5}(Al_xGa_{1-x})_{0.5}P$ confinement layer 34, preferably n-doped with silicon, on the GaAs substrate 12, disposed after n-doped $In_{0.5}(Al_xGa_{1-x})_{0.5}P$ confinement layer 34 as viewed from GaAs substrate 12, an n-doped active $In_{0.5}(Al_yGa_{1-y})_{0.5}P$ layer 36 that is preferably n-doped with telluride, and disposed after n-doped active $In_{0.5}(Al_yGa_{1-y})_{0.5}P$ layer 36 as viewed from GaAs substrate 12, a p-doped $In_{0.5}(Al_xGa_{1-x})_{0.5}P$ confinement layer 38 that is preferably p-doped with magnesium and/or zinc.

The active layer in this case can be a homogeneous layer, or it can be formed by a quantum well or multiple quantum well structure.

As in the preceding exemplary embodiments, therefore, with a correspondingly advantageous effect on the LED, silicon is used as the first n-dopant for the n-type confinement layer 34 and telluride as the second dopant for the active layer 36.

It is understood that the features of the invention disclosed in the foregoing description, in the drawings and in the claims can be essential to the implementation of the invention both individually and in any combination.

The invention naturally is not limited to the exemplary embodiments by the description of it with reference thereto. Rather, the invention encompasses any novel feature and any combination of features, including in particular any combination of individual features specified in the various claims or the various exemplary embodiments, even if the feature or combination concerned is not explicitly mentioned per se in the claims or exemplary embodiments.

The invention claimed is:

1. A radiation-emitting semiconductor component with a layer structure comprising
   an n-doped confinement layer doped with a first n-dopant,
   a p-doped confinement layer, and
   an active, photon-emitting layer disposed between said n-doped confinement layer and said p-doped confinement layer, and doped with a second n-dopant different from the first n-dopant, wherein
      at least one layer of the layer structure is formed of a material selected from the group consisting of AlInGaP, AlGaAs, InGaAlAs, and InGaAsP,
   a first waveguide layer doped with said second n-dopant is disposed between said active layer and said n-doped confinement layer, and a second waveguide layer is disposed between said active layer and said p-doped confinement layer, and
   the first waveguide layer comprises a single layer that is doped with the second n-dopant and adjoins the active layer.

2. The radiation-emitting semiconductor component as recited in claim 1, wherein said first n-dopant comprises silicon.

3. The radiation-emitting semiconductor component as recited in claim 1, wherein said second n-dopant comprises telluride.

4. The radiation-emitting semiconductor component as recited in claim 1, wherein said p-doped confinement layer comprises magnesium, carbon or zinc dopant.

5. A radiation-emitting semiconductor component with a layer structure comprising
   an n-doped confinement layer doped with a first n-dopant,
   a p-doped confinement layer, and
   an active, photon-emitting layer disposed between said n-doped confinement layer and said p-doped confinement layer, and doped with a second n-dopant different from the first n-dopant, wherein
      at least one layer of the layer structure is formed of a material selected from the group consisting of AlInGaP, AlGaAs, InGaAlAs, and InGaAsP,
   said n-doped confinement layer further includes the second n-dopant or an additional n-dopant,
   a first waveguide layer doped with said second n-dopant is disposed between said active layer and said n-doped confinement layer, and a second waveguide layer is disposed between said active layer and said p-doped confinement layer, and
   the first waveguide layer comprises a single layer that is doped with the second n-dopant and adjoins the active layer.

6. The radiation-emitting semiconductor component as recited in claim 5, wherein said first n-dopant comprises silicon.

7. The radiation-emitting semiconductor component as recited in claim 5, wherein said second n-dopant comprises telluride.

8. The radiation-emitting semiconductor component as recited in claim 5, wherein said p-doped confinement layer comprises magnesium, carbon or zinc dopant.

9. The radiation-emitting semiconductor component as recited in claim 5, wherein the additional dopant is said second n-dopant.

* * * * *

UNITED STATES PATENT AND TRADEMARK OFFICE
CERTIFICATE OF CORRECTION

| | | |
|---|---|---|
| PATENT NO. | : 7,629,670 B2 | Page 1 of 1 |
| APPLICATION NO. | : 10/561318 | |
| DATED | : December 8, 2009 | |
| INVENTOR(S) | : Rainer Butendeich et al. | |

It is certified that error appears in the above-identified patent and that said Letters Patent is hereby corrected as shown below:

Page 2
U.S. Patent Documents, replace "2002/1010499  8/2002  Kuo et al. ..... 257/79" with
-- 2002/0104997  8/2002  Kuo et al. ..... 257/79 --

Signed and Sealed this
Twenty-third Day of August, 2011

David J. Kappos
*Director of the United States Patent and Trademark Office*